(12) United States Patent
Tanifuji

(10) Patent No.: US 10,135,332 B2
(45) Date of Patent: Nov. 20, 2018

(54) DC-DC CONVERTER

(71) Applicant: Kabushiki Kaisha Toshiba, Minato-ku, Tokyo (JP)

(72) Inventor: Ryo Tanifuji, Fujisawa Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/692,035

(22) Filed: Aug. 31, 2017

(65) Prior Publication Data

US 2018/0278156 A1 Sep. 27, 2018

(30) Foreign Application Priority Data

Mar. 21, 2017 (JP) ................. 2017-055127

(51) Int. Cl.
| | |
|---|---|
| *H02M 3/158* | (2006.01) |
| *H02M 3/02* | (2006.01) |
| *H02M 1/36* | (2007.01) |
| *H03K 7/08* | (2006.01) |
| *H02M 1/00* | (2006.01) |

(52) U.S. Cl.
CPC ........... *H02M 3/02* (2013.01); *H02M 1/36* (2013.01); *H03K 7/08* (2013.01); *H02M 3/158* (2013.01); *H02M 2001/0012* (2013.01)

(58) Field of Classification Search
CPC ............ H02M 1/36; H02M 1/14; H02M 1/15; H02M 3/02; H02M 3/156; H02M 3/158; H02M 2001/0012; H02M 2003/156; H02M 2003/158; H03K 7/08
See application file for complete search history.

(56) References Cited

U.S. PATENT DOCUMENTS

| | | | | |
|---|---|---|---|---|
| 7,417,412 | B2* | 8/2008 | Koh ..................... | H02M 3/1563 323/284 |
| 8,525,505 | B2* | 9/2013 | Wang ..................... | H02M 1/14 323/286 |
| 2011/0221415 | A1* | 9/2011 | Otsuka ................ | H02M 3/1588 323/283 |
| 2016/0124447 | A1* | 5/2016 | Kobayashi ............. | G05F 1/575 323/280 |
| 2016/0164415 | A1* | 6/2016 | Yamane ................ | H02M 3/158 323/271 |

FOREIGN PATENT DOCUMENTS

JP 2014-128038 A 7/2014

* cited by examiner

*Primary Examiner* — Matthew Nguyen
(74) *Attorney, Agent, or Firm* — White & Case LLP

(57) ABSTRACT

According to one embodiment, a DC-DC converter includes a signal generator configured to output a first PWM signal having arbitrary amplitude and a duty cycle established based on an input voltage and an output voltage, a driver configured to output a second PWM signal being in phase with the first PWM signal and having amplitude of the input voltage based on the first PWM signal, a filter configured to extract a DC component from the second PWM signal, and a switch configured to supply an output of the filter to the signal generator in response to a first control signal.

12 Claims, 4 Drawing Sheets

DC-DC CONVERTER

CROSS-REFERENCE TO RELATED APPLICATIONS

This application is based upon and claims the benefit of priority from Japanese Patent Application No. 2017-055127, filed on Mar. 21, 2017; the entire contents of which are incorporated herein by reference.

FIELD

An embodiment of the invention relates to a DC-DC converter.

BACKGROUND

There is known an application for switching power supply lines and power supply circuits to supply a common output voltage.

DETAILED DESCRIPTION

Figure 1:
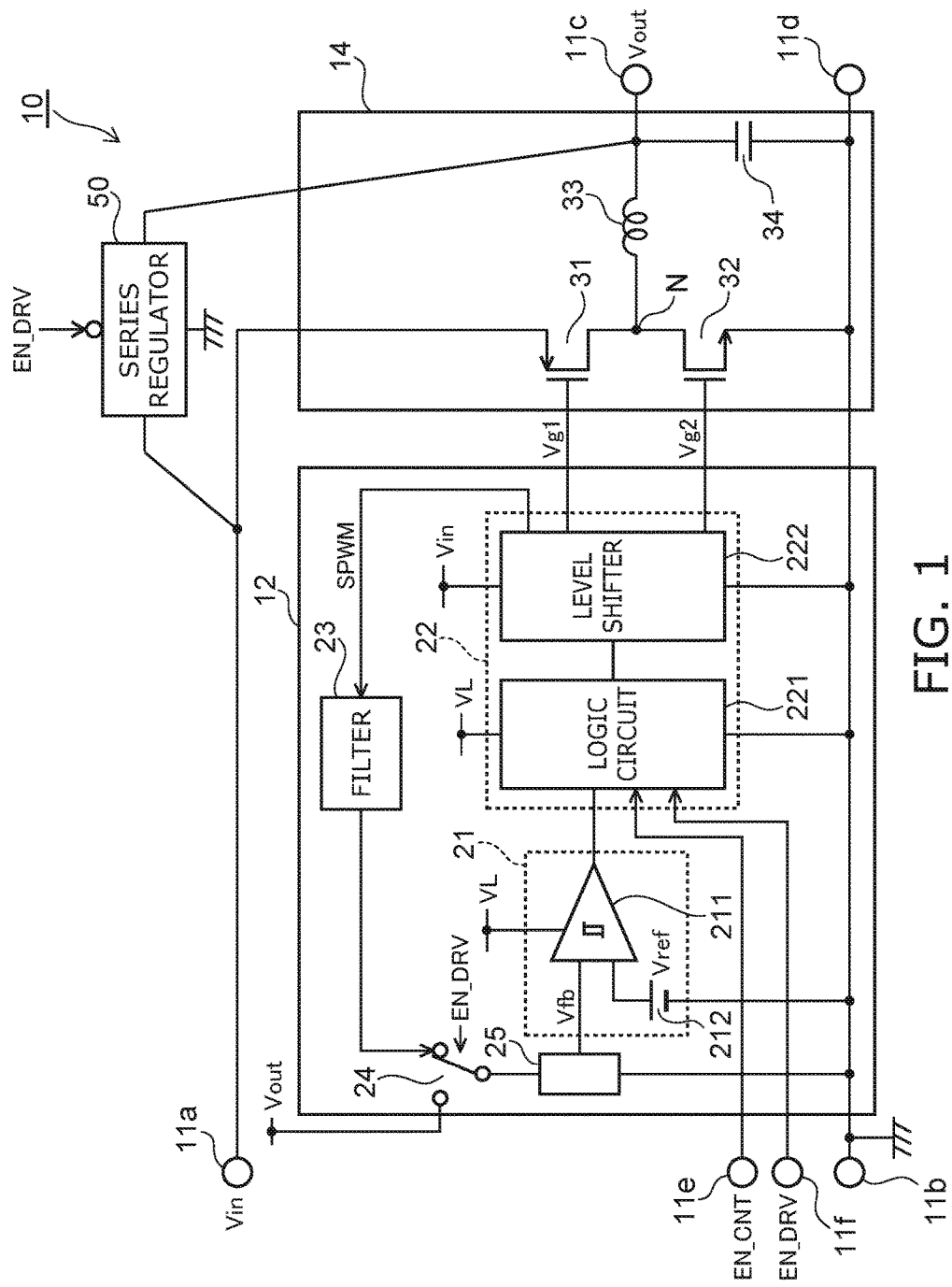
FIG. 1 is a block diagram illustrating a DC-DC converter according to an embodiment.

According to one embodiment, there is provided a DC-DC converter including: a signal generator configured to output a first PWM signal having arbitrary amplitude and a duty cycle established based on an input voltage and an output voltage; a driver configured to output a second PWM signal being in phase with the first PWM signal and having amplitude of the input voltage based on the first PWM signal; a filter configured to extract a DC component from the second PWM signal; and a switch configured to supply an output of the filter to the signal generator in response to a first control signal.

An embodiment of the invention is described below with reference to the drawings.

Note that the drawings are schematic or conceptual. Relations between thicknesses and widths of portions, ratios of the sizes among the portions, and the like are not always the same as real ones. Even if the same portions are shown, dimensions and ratios of the portions are sometimes shown different depending on the drawings.

Note that, in the specification and the drawings, components same as the components already shown in the drawings and described are denoted by the same reference numerals and signs and detailed description of the components is omitted as appropriate.

FIG. 1 is a block diagram illustrating a DC-DC converter according to an embodiment.

As shown in FIG. 1, the DC-DC converter 10 includes input terminals 11a, 11b and output terminals 11c, 11d. The DC-DC converter 10 is connected to an input power supply (not shown) through the input terminals 11a, 11b. The input power supply is a DC power supply. The input power supply may be an unstabilized DC power supply such as a pulsating voltage produced by regulating and smoothing an AC voltage, and a battery terminal voltage, or a stabilized DC power supply.

The DC-DC converter 10 is connected to a load (not shown) through the output terminals 11c, 11d. The load is e.g. a resistive load. The DC-DC converter 10 is a switching power supply circuit. By the DC-DC converter 10, an input voltage Vin supplied to the input terminals 11a, 11b is supplied to the load through the output terminals 11c, 11d.

The output terminals 11c, 11d of the DC-DC converter 10 are connected to the output of another power supply circuit. In this example, the DC-DC converter 10 is connected with the output of a series regulator 50. The regulator 50 is connected in parallel with the DC-DC converter 10. That is, the input of the regulator 50 is connected to the input terminal 11a of the DC-DC converter 10. The output of the regulator 50 is connected to the output terminal 11c of the DC-DC converter 10. The ground of the regulator 50 is connected to the input terminal 11b and the output terminal 11d of the DC-DC converter 10. The DC-DC converter 10 and the regulator 50 are configured to be able to output the same output voltage.

As described later in detail, the DC-DC converter 10 operates exclusively with the regulator 50. That is, when the DC-DC converter 10 supplies an output voltage to the load, the regulator 50 stops output. When the regulator 50 supplies an output voltage to the load, the DC-DC converter 10 stops output.

For instance, when the load requires a low-noise voltage, the regulator 50 is selected. For instance, when the input voltage is high or the load requires high power, the DC-DC converter 10 is selected. Such selection is not limited to these cases, but arbitrarily established depending on e.g. the requirements of the load and the system.

The DC-DC converter 10 includes two control terminals 11e, 11f. One control terminal 11e is inputted with a control signal EN_CNT (second control signal) for selecting the operable state and the stop state of the DC-DC converter 10. For instance, when the control signal EN_CNT is H level, the DC-DC converter 10 is turned to the operable state. In the operable state, the DC-DC converter 10 does not supply the output voltage to the load while performing oscillation. More specifically, the PWM generator (signal generator) 21 is supplied with power and operated. However, the driver 22 does not output drive signals Vg1, Vg2. The switching elements 31, 32 are maintained in the off-state.

When the control signal EN_CNT is L level, the DC-DC converter 10 is turned to the stop state. In the stop state, the DC-DC converter 10 cuts off power supply to all the circuits of the controller 12 including the PWM generator 21. Thus, the DC-DC converter 10 is turned to the state of lowest power consumption.

In the following, turning the DC-DC converter 10 to the operable state by the control signal EN_CNT is also referred to as making the control signal EN_CNT active. Turning the DC-DC converter 10 to the stop state by the control signal EN_CNT is also referred to as making the control signal EN_CNT inactive.

A control signal EN_DRV (first control signal) for selecting the operating state and the operable state of the DC-DC converter 10. The control signal EN_DRV is inputted after the control signal EN_CNT becomes active. For instance, when the control signal EN_CNT becomes H level and then the control signal EN_DRV becomes H level, the DC-DC converter 10 is turned to the operating state. In the operating state, the DC-DC converter 10 maintains the operation of the PWM generator 21, and the driver 22 supplies the drive signals Vg1, Vg2 to the switching elements 31, 32, respectively. By the operation of the switching elements 31, 32, the DC-DC converter 10 supplies the load with an established output voltage. The DC-DC converter 10 supplies the load with an output current depending on the connected load. When the control signal EN_DRV is L level, the DC-DC converter 10 is maintained in the operable state.

In the following, turning the DC-DC converter 10 to the operating state by the control signal EN_DRV is also referred to as making the control signal EN_DRV active. Turning the DC-DC converter 10 to the operable state by the control signal EN_DRV is also referred to as making the control signal EN_DRV inactive. In this example, as described later in detail, the control signal EN_DRV can become active after the control signal EN_CNT becomes active.

Thus, when the control signal EN_CNT is inactive, the control signal EN_DRV is inactive, and the DC-DC converter 10 is in the stop state. When the control signal EN_CNT becomes active and the control signal EN_DRV is inactive, the DC-DC converter 10 is in the operable state. When the control signals EN_CNT, EN_DRV are both active, the DC-DC converter 10 is in the operating state.

In the operable state of the DC-DC converter 10, the PWM generator 21 operates at a duty cycle established depending on the input voltage and the output voltage. In the operable state of the DC-DC converter 10, the switching elements 31, 32 for supplying power to the load do not operate. Thus, the DC-DC converter 10 does not supply power to the load.

When the DC-DC converter 10 is turned to the operating state (EN_CNT, EN_DRV are both active), the switching elements 31, 32 are enabled. Thus, the DC-DC converter 10 supplies power to the load.

The configuration of the DC-DC converter 10 is described in more detail.

The DC-DC converter 10 includes a controller 12 and a power converter 14. The power converter 14 includes switching elements 31, 32, a coil 33, and an output capacitor 34.

In this example, the switching elements 31, 32 are connected in series between the input terminals 11a, 11b. The coil 33 is connected between the connection node N of the switching elements 31, 32 and the output terminal 11c. The output capacitor is connected between the output terminals 11c, 11d. The power converter 14 can convert the input voltage Vin to the output voltage Vout lower than the input voltage Vin.

The controller 12 is connected to the power converter 14. The controller 12 outputs drive signals Vg1, Vg2. The drive signals Vg1, Vg2 are signals for driving the switching elements 31, 32. The drive signals Vg1, Vg2 have a duty cycle depending on the input voltage Vin and the output voltage Vout. The drive signals Vg1, Vg2 are complementary. Thus, the switching elements 31, 32 can be turned on and off alternately.

The controller 12 includes a PWM generator 21, a driver 22, a filter 23, and a switch 24.

The PWM generator 21 includes a hysteresis comparator 211 and a reference voltage source 212. One input of the hysteresis comparator 211 is connected with the reference voltage source 212. The other input of the hysteresis comparator 211 is connected with the output of an output voltage detector 25. The hysteresis comparator 211 inverts the output when the voltage inputted to the other input reaches the reference voltage Vref outputted by the reference voltage source 212. The hysteresis comparator 211 inverts the output when the voltage supplied from the detector 25 is lowered to the voltage that is lower by the hysteresis voltage than the reference voltage Vref.

The driver 22 is connected between the output of the PWM generator 21 and the switching elements 31, 32. The driver 22 includes e.g. a logic circuit 221 and a level shifter 222. The level shifter 222 is connected to the input terminal 11a and operated by the input voltage Vin. On the other hand, the logic circuit 221 is operated at a voltage lower than the input voltage Vin. For instance, the logic circuit 221 is operated by an internal power supply (not shown) for outputting a constant voltage VL generated inside the controller 12.

The logic circuit 221 can enable or disable the drive signals Vg1, Vg2 in response to the control signals EN_CNT, EN_DRV. The drive signals Vg1, Vg2 are signals having a voltage level for driving the switching elements 31, 32. The logic circuit 221 may be included partly or entirely in the level shifter 222.

The logic circuit 221 generates logic signals for performing or cutting off power supply to the controller 12 in response to the control signal EN_CNT. For instance, when the control signal EN_CNT is L level (inactive), power supply to the PWM generator 21 is cut off. When the control signal EN_CNT is H level (active), power is supplied to the PWM generator 21. In the controller 12, the PWM generator 21 can be turned to the operable state by receiving power supply. By setting the control signal EN_CNT to L level, power supply to major parts of the controller 12 such as the PWM generator 21 can be cut off. This can reduce power consumption of the DC-DC converter 10.

The driver 22 generates the drive signals Vg1, Vg2 in response to the PWM signal outputted from the PWM generator 21. The level shifter 222 outputs the drive signals Vg1, Vg2 after shifting to the voltage level that can drive the switching elements 31, 32. The switching elements 31, 32 are driven by the level-shifted drive signals Vg1, Vg2.

The driver 22 generates and outputs a standby PWM signal SPWM having amplitude nearly equal to the input voltage Vin and being in phase with the PWM signal. The signal SPWM is generated by the level shifter 222. Here, "standby" means being in the operable state ("EN_CNT=H" and "EN_DRV=L"). That is, the signal SPWM is a signal generated in the operable state.

The filter 23 is connected between the output of the driver 22 and the input of the PWM generator 21. The switch 24 is further provided between the output of the filter 23 and the input of the PWM generator 21.

The filter 23 is e.g. a low-pass filter. The signal SPWM outputted from the driver 22 is a rectangular wave having a duty cycle D ($\approx$Vout/Vin). By passing through the filter 23, harmonic components are removed, and the DC component is extracted. The signal SPWM has the amplitude and the duty cycle D of the input voltage Vin. Thus, its DC component is nearly equal to the output voltage Vout.

One input of the switch 24 is connected with the output of the filter 23. The other input of the switch 24 is connected with the output terminal 11c. In response to the control signal EN_DRV, the switch 24 supplies the PWM generator 21 with one of the signal SPWM outputted from the filter 23 and the output voltage Vout.

The output of the switch 24 is connected to the input of the detector 25.

In this example, when the control signal EN_DRV is inactive (e.g. L level), the switch 24 supplies the output of the filter 23 to the detector 25. When the control signal EN_DRV is active (e.g. H level), the switch 24 supplies the output voltage Vout to the detector 25.

The detector 25 detects the voltage between the output terminals 11c, 11d or the output of the filter 23, and outputs a feedback voltage Vfb proportional to these voltages. That is, the feedback voltage Vfb is supplied to the other input of the hysteresis comparator 211.

The PWM generator 21 outputs a PWM signal in response to the feedback voltage Vfb. The PWM generator 21 is operated by e.g. the voltage VL supplied from the internal power supply. Thus, the amplitude of the PWM signal outputted by the PWM generator 21 is nearly equal to the magnitude of the output voltage of the internal power supply. When the voltage VL outputted by the internal power supply is 5 V, the amplitude of the PWM signal is approximately 5 V.

The PWM signal outputted by the PWM generator 21 has a duty cycle D determined by the ratio of the input voltage Vin and the output voltage Vout of the DC-DC converter 10. The duty cycle D is nearly equal to Vout/Vin.

In the DC-DC converter 10, before the output of the regulator 50 is switched to the output of the power converter 14 by the control signal EN_DRV, the PWM generator 21 is operated by the control signal EN_CNT at the duty cycle D determined by the input and output voltages. Thus, when the output of the regulator 50 is switched to the output of the power converter 14, the variation of the output voltage Vout can be suppressed.

The operation of the DC-DC converter 10 of the embodiment is described.

Figure 2:
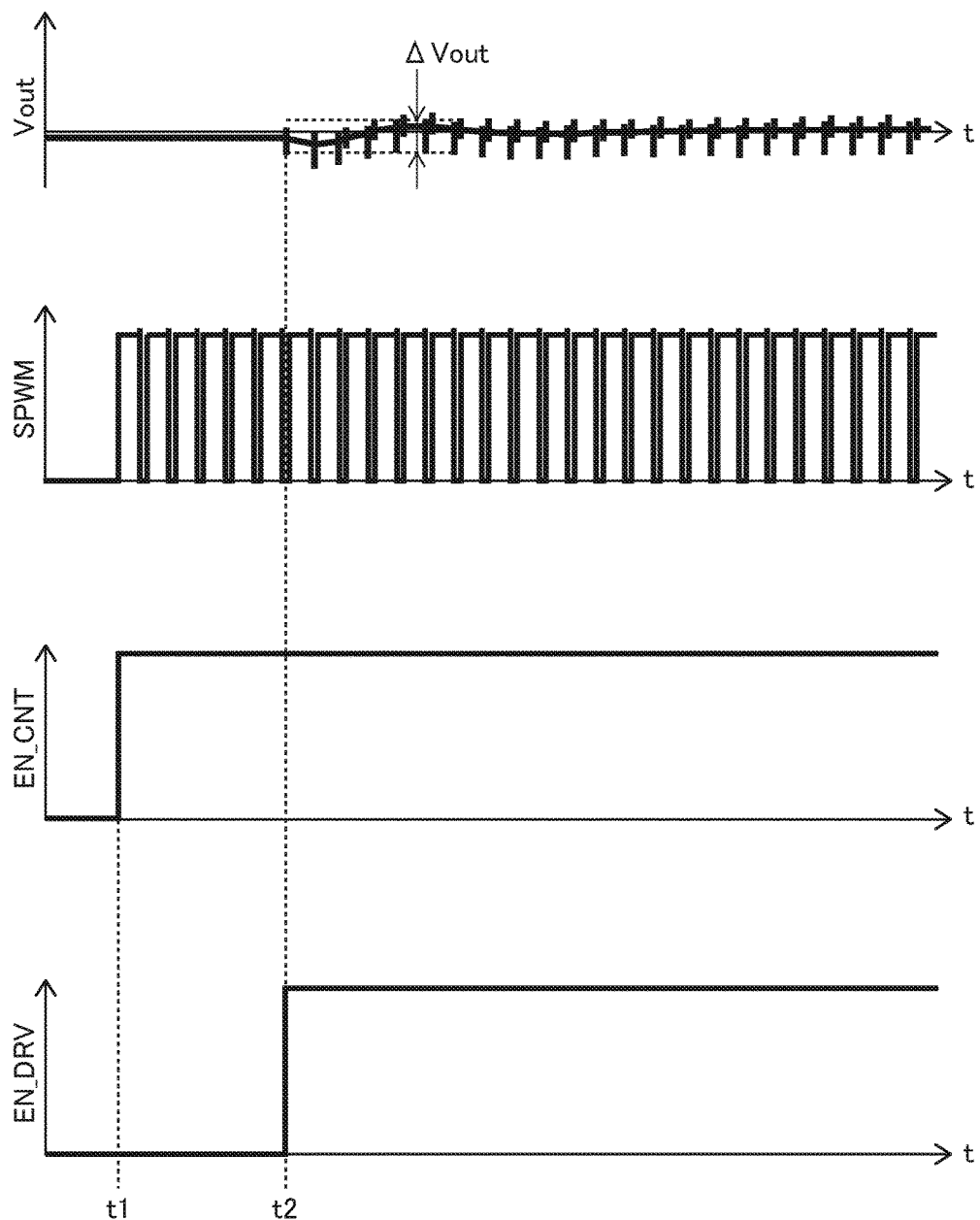
FIG. 2 is an example of the operation waveform of the DC-DC converter.

FIG. 2 is an example of the operation waveform of the DC-DC converter 10.

The uppermost graph of FIG. 2 shows the temporal variation of the output voltage Vout of the DC-DC converter 10.

The second graph of FIG. 2 shows the temporal variation of the signal SPWM having the amplitude of the input voltage Vin outputted by the driver 22.

The third graph of FIG. 2 shows the temporal variation of the control signal EN_CNT.

The lowermost graph of FIG. 2 shows the temporal variation of the control signal EN_DRV.

As shown in FIG. 2, the control signals EN_CNT, EN_DRV are successively made active. When the control signal EN_CNT is L level before time t1, power supplied to major parts constituting the controller 12 is cut off. Thus, the controller 12 is in the cut-off state. The power converter 14 is also in the cut-off state. Thus, the power consumption of the DC-DC converter 10 is lowest.

At time t1, the control signals EN_CNT transitions from L level to H level and is made active. The controller 12 is supplied with power, and the PWM generator 21 starts operation. The control signal EN_DRV is L level. Thus, the switch 24 supplies the output of the filter 23 to the input of the detector 25.

After time t1, the PWM generator 21 outputs a PWM signal with a duty cycle D nearly equal to Vout/Vin.

The driver 22 converts the amplitude of this PWM signal to Vin and supplies it to the filter 23.

The filter 23 removes harmonic components from the rectangular wave with amplitude Vin and duty cycle D (≈Vout/Vin) and extracts the DC component. This DC component is nearly equal to the output voltage Vout.

At time t2, the control signals EN_DRV transitions from L level to H level and is made active. The switch 24 supplies the voltage between the output terminals 11c, 11d to the input of the detector 25. Thus, the PWM generator 21 establishes the duty cycle D in response to the output voltage Vout and the input voltage Vin produced between the output terminals 11c, 11d.

Until time t2, the regulator 50 outputs the output voltage Vout. At time t2, the regulator 50 is cut off by the control signals EN_DRV being made active.

By the operation described above, the DC-DC converter 10 can supply the output voltage to the load while suppressing the variation of the output voltage Vout. That is, the load is supplied with the output voltage switched from another power supply line (power supply circuit) to the DC-DC converter 10.

The effect of the DC-DC converter 10 of the embodiment is described by comparison with the operation of a DC-DC converter of a comparative example.

Figure 3A:
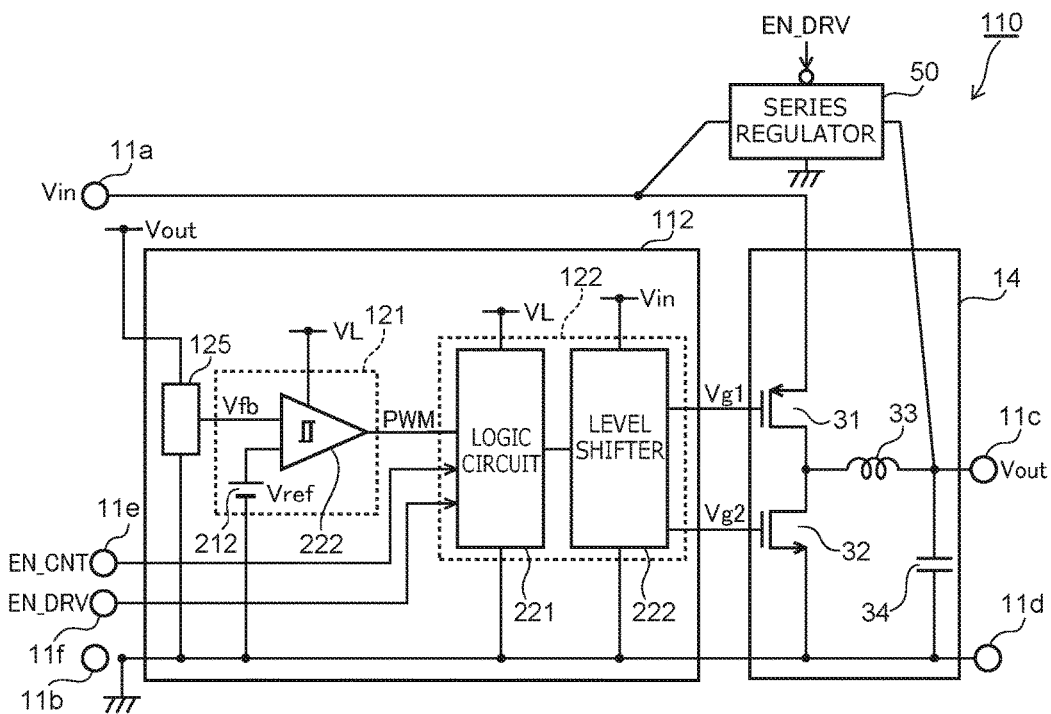
FIG. 3A is a block diagram of a DC-DC converter 110 of a comparative example.
Figure 3B:
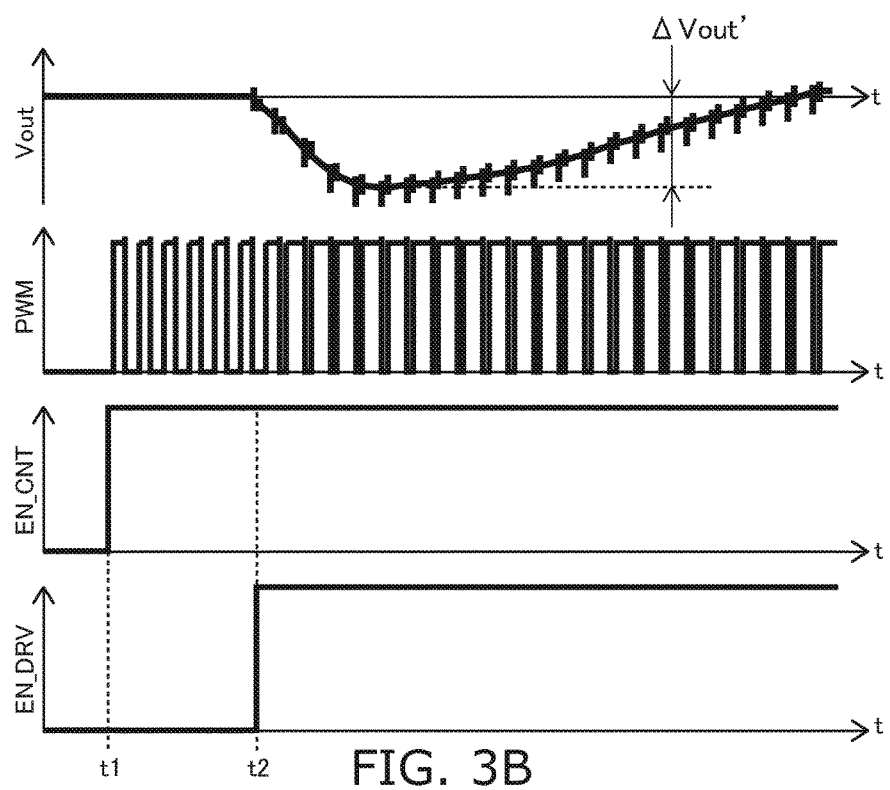
FIG. 3B is an operation waveform of the DC-DC converter 110 of the comparative example.

FIG. 3A is a block diagram of a DC-DC converter 110 of a comparative example. FIG. 3B is an operation waveform of the DC-DC converter 110 of the comparative example.

As shown in FIG. 3A, the DC-DC converter 110 of the comparative example includes a controller 112 and a power converter 14. The DC-DC converter 110 is different from the DC-DC converter 10 of the embodiment in the configuration of the controller 112. The controller 112 includes a PWM generator 121 and a driver 122. The controller 112 is different from that of the DC-DC converter 10 of the embodiment in not including the filter and the switch.

In the DC-DC converter 110 of the comparative example, in response to the control signals EN_CNT, EN_DRV, the controller 112 is operated or stopped, and the power converter 14 is operated or stopped.

The DC-DC converter 110 of the comparative example performs an operation different from that of the embodiment when the control signal EN_CNT is made active and the controller 112 starts operation. In the DC-DC converter 110 of the comparative example, when the control signal EN_CNT is active (the control signal EN_DRV is inactive), the PWM signal generation section 121 operates at a duty cycle Dfix established based on the output voltage Vout and the reference voltage Vref and outputted from the voltage detector 125.

More specifically, as shown in FIG. 3B, at time t1, the controller 112 is operated at a fixed duty cycle Dfix by the control signal EN_CNT. The duty cycle Dfix can be established arbitrarily, such as 50%. In FIG. 3B, the PWM signal outputted by the PWM signal generation section 121 is shown (the second graph of FIG. 3B) instead of the signal SPWM of FIG. 2.

At time t2, the control signal EN_DRV is made active. Thus, the power converter 14 starts operation. The actual duty cycle D at which the power converter 14 operates is determined by the ratio of the input voltage Vin and the output voltage Vout, and unrelated to the preset duty cycle Dfix. Before the control signal EN_DRV is made active, the PWM signal generation section 121 is operated at the fixed duty cycle Dfix by the control signal EN_CNT. Thus, the duty cycle can be made close to the target duty cycle earlier than starting the power converter 14 from a duty of 0%. However, the output voltage of the DC-DC converter 110 is varied due to the difference between the fixed duty cycle Dfix and the actual duty cycle D.

In this example, the input voltage is 4 V, and the output voltage is 3 V. In this case, the actual duty cycle is 3 V/4 V=75%. In the operable state, the duty cycle is set to 50%.

Then, the output voltage decreases until the duty cycle reaches 75%. Due to the difference between the actual duty cycle and the fixed duty cycle, the output voltage varies after the operable state is turned to the operation state. This produces a period in which the output voltage becomes higher or lower.

In contrast, in the DC-DC converter 10 of the embodiment, when the control signal EN_CNT is made active, the DC component of the signal SPWM having the amplitude of the input voltage is extracted by the filter 23 and compared with the reference voltage Vref. Thus, the PWM generator 21 can be operated at a duty cycle D nearly equal to that during actual operation. Then, the control signal EN_DRV is made active. Thus, the power converter 14 can output an output voltage nearly equal to that during EN_CNT being active.

The variation ΔVout (FIG. 2) of the output voltage of the DC-DC converter 10 of the embodiment can be suppressed below 1/100 of the variation ΔVout' of the comparative example.

Thus, the operable state is provided in the case of switching the supply of the output voltage to the load from the regulator 50 to the DC-DC converter 10. In the operable state, the duty cycle of the PWM signal that can be outputted by the PWM generator 21 is made close to the actual duty cycle. This can suppress the variation of the output voltage of the DC-DC converter 10.

In the case described above, the PWM generator 21 is operated by the internal power supply having a voltage VL lower than the input voltage Vin. The driver 22 includes a level shifter 222 for driving the switching elements. However, the embodiment is not limited thereto. For instance, in the case of low input voltage Vin, the controller 12 including the PWM generator 21 may operate at a single input voltage Vin. In such cases, the driver 22 does not need to include the level shift section. The driver 22 can be turned to the operable state by supplying the signal SPWM to the filter 23 without the intermediary of the level shift section.

(Variation)

Figure 4A:
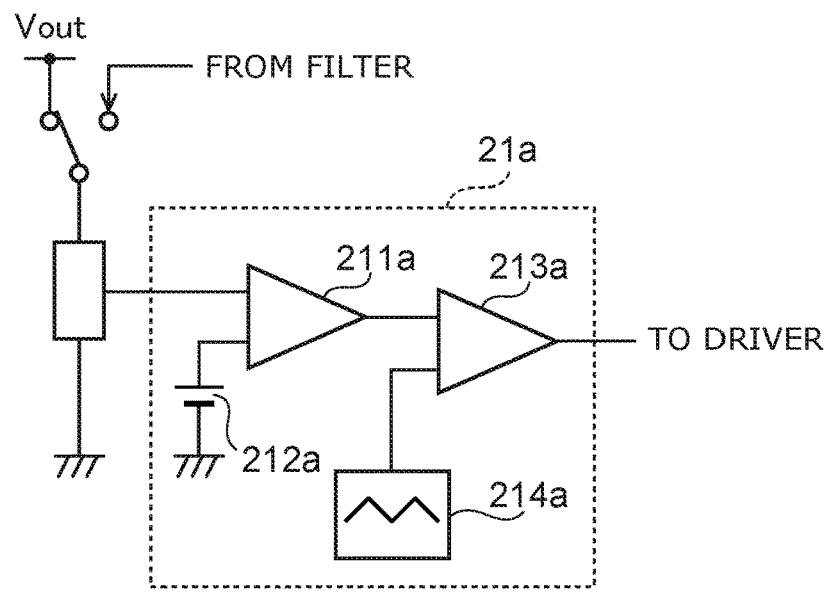
FIG. 4A is a block diagram illustrating part of a DC-DC converter of a variation.
Figure 4B:
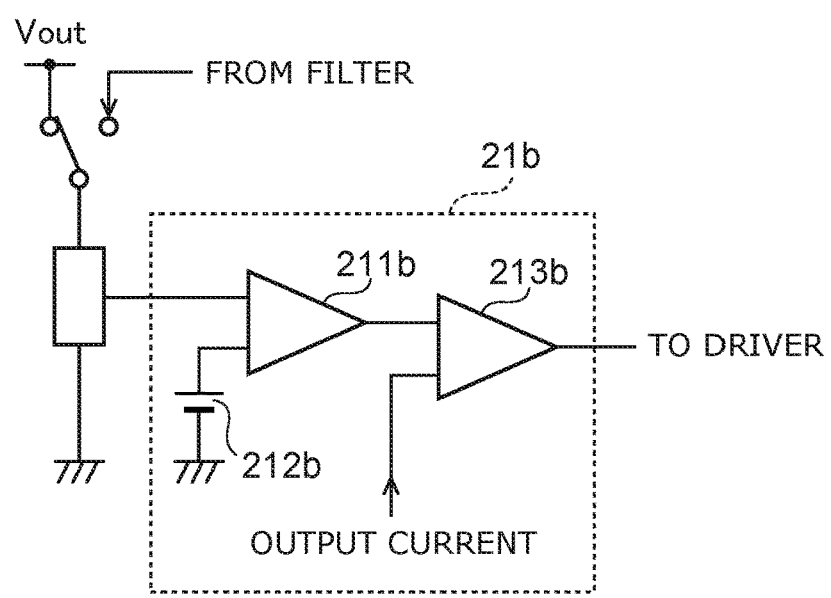
FIG. 4B is a block diagram illustrating part of a DC-DC converter of other variation.

FIGS. 4A and 4B are block diagrams illustrating part of a DC-DC converter of a variation.

The example of the DC-DC converter described above is based on the ripple control scheme in which the PWM generator includes a hysteresis comparator 211 and a reference voltage source 212. However, the embodiment is not limited to the foregoing, but is also applicable to variations of the ripple control scheme. The embodiment is also applicable to PWM control schemes other than the ripple control scheme.

As shown in FIG. 4A, the control scheme of the DC-DC converter can be the voltage mode control. In this control scheme, the PWM generator 21a includes an error amplifier 211a, a reference voltage source 212a, a PWM comparator 213a, and an oscillator 214a. One input of the error amplifier 211a is connected with the output of the detector 25. The other input of the error amplifier 211a is connected with the reference voltage source 212a. The output of the error amplifier 211a is connected to one input of the PWM comparator 213a. The other input of the PWM comparator 213a is connected to the oscillator 214a. The oscillator 214a generates and outputs e.g. a triangular wave. The PWM comparator 213a compares the triangular wave of the oscillator 214a with the output of the error amplifier 211a and outputs a PWM signal. The PWM signal is supplied to the driver 22.

Also in the voltage control scheme, as in the embodiment described above, the switch 24 is switched in response to the control signals EN_CNT, EN_DRV. However, before and after the switching, the PWM generator 21a outputs a PWM signal with a nearly equal duty cycle. This can almost avoid the variation of the output voltage even in the switching of power supply lines.

As shown in FIG. 4B, the control scheme of the DC-DC converter may be the current mode control. The PWM generator 21b of the current mode control includes an error amplifier 211b, a reference voltage source 212b, and a PWM comparator 213b. The error amplifier 211b and the reference voltage source 212b are connected as in the case of the voltage mode control. The output of the error amplifier 211b is inputted to one input of the PWM comparator 213b. The other input of the PWM comparator 213b is inputted with a signal related to the output current of the power converter 14. In this case, the output current of the power converter 14 is inputted after being converted to the voltage proportional to the current flowing in the coil.

Thus, the embodiment is applicable irrespective of whether the control scheme is the voltage mode control or the current mode control.

In the case described above, the DC-DC converter is of the step-down type. However, the embodiment is also applicable to other circuit schemes if a rectangular wave signal with the amplitude being the voltage value of the input voltage can be inputted to the filter and compared with the reference power supply in the driving section. The embodiment is not limited to the step-down type, but is also applicable to the step-up type, the step-up/down type, and the inverting type.

The power supply line for exclusively supplying the output voltage is not limited to the series regulator, but may be a switching regulator. The input voltage of the power supply line for complementary supplying the output voltage does not necessarily need to be common. A common output voltage may be exclusively supplied from a different input voltage source.

The embodiment described above can realize a DC-DC converter that can supply a stable output voltage to the load even when the output is switched from another power supply circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A DC-DC converter comprising:
   a signal generator configured to output a first PWM signal having arbitrary amplitude and a duty cycle established based on an input voltage and an output voltage;
   a driver configured to output a second PWM signal being in phase with the first PWM signal and having amplitude of the input voltage based on the first PWM signal;
   a filter configured to extract a DC component from the second PWM signal; and
   a switch configured to supply an output of the filter to the signal generator in response to a first control signal.

2. The converter according to claim 1, wherein duty cycle of the second PWM signal is determined depending on ratio of the output voltage and the input voltage.

3. The converter according to claim 1, further comprising:
an output voltage detection section configured to output a feedback signal depending on the output voltage,
wherein when the first control signal is active, the switch connects the output of the filter with an input of the signal generator, and
the signal generator and the driver are started by a second control signal that has become active before the first control signal, and by the first control signal becoming active, connection between the output of the filter and the input of the signal generator is disconnected, and an output of the output voltage detection section is connected with the input of the signal generator.

4. The converter according to claim 3, further comprising:
a first switching element connected between the input and the output,
wherein the driver enables the switching element by the first control signal becoming active.

5. The converter according to claim 4, further comprising:
another power conversion circuit with an output connected to the converter,
wherein the power conversion circuit is turned off based on the first control signal that has become active.

6. The converter according to claim 5, wherein the other power conversion circuit includes a series regulator.

7. The converter according to claim 6, wherein the series regulator is connected in parallel.

8. The converter according to claim 4, further comprising:
a second switching element connected in series with the first switching element; and
a coil connected to a connection node of the first switching element and the second switching element.

9. The converter according to claim 1, wherein
the signal generator is operated by being supplied with a first voltage, and
the driver is operated by being supplied with a second voltage higher than the first voltage.

10. The converter according to claim 1, wherein the signal generator includes a hysteresis comparator.

11. The converter according to claim 1, wherein the signal generator includes an oscillator configured to generate a triangular wave.

12. The converter according to claim 1, wherein the signal generator includes a comparator configured to receive a feedback input of data related to an output current.

* * * * *